United States Patent [19]
Borucki et al.

[11] 3,970,929
[45] July 20, 1976

[54] TEST APPARATUS FOR USE WITH A HEATING SYSTEM

[76] Inventors: Eugene W. Borucki, 8115 N. Greenwood, Niles, Ill. 60648; Peter P. Zaloga, 5818 W. Newport, Chicago, Ill. 60634

[22] Filed: Aug. 22, 1974

[21] Appl. No.: 499,471

[52] U.S. Cl............................. 324/73 R; 340/214; 432/32
[51] Int. Cl.².................. G01R 15/12; G08B 25/00; F27D 21/00
[58] Field of Search................... 324/73 R; 236/94; 431/13, 14, 24; 432/32; 340/214

[56] References Cited
UNITED STATES PATENTS

| | | | |
|---|---|---|---|
| 2,839,741 | 6/1958 | Kratville | 340/214 |
| 2,956,226 | 10/1960 | Vogt et al. | 324/73 R |
| 2,980,898 | 4/1961 | Mason et al. | 324/73 R X |
| 3,681,681 | 8/1972 | Auslander | 324/73 R X |
| 3,699,440 | 10/1972 | Johnson et al. | 324/73 R |
| 3,743,009 | 7/1973 | Dagerford | 236/94 X |

*Primary Examiner*—John K. Corbin
*Assistant Examiner*—Rolf Hille
*Attorney, Agent, or Firm*—Prangley, Dithmar, Vogel, Sandler & Stotland

[57] ABSTRACT

Test apparatus is disclosed for testing a gas-fired forced air heating system having a plurality of control elements. A monitoring device includes an indicator light adjacent to the thermostat for indicating a malfunction in the heating system, the monitoring device including condition-responsive switches for energizing the indicator in response to the absence of a stream of heated air when called for by the thermostat or in response to a malfunction in the thermostat. An analyzer comprises a plurality of indicator lights connectable through a selector switch to the power source and the heating system, the switch having an OFF condition for disconnecting the indicator lights, a TEST condition for checking the condition of the indicator lights and an ON condition for connecting the indicator lights respectively in parallel with corresponding heating system control elements to test the conditions thereof. Two embodiments of the analyzer are disclosed for use with different types of heating systems.

10 Claims, 3 Drawing Figures

TEST APPARATUS FOR USE WITH A HEATING SYSTEM

BACKGROUND OF THE INVENTION

The present invention relates to test apparatus for use with a heating system, particularly a heating system of the gas-fired forced air type. The test apparatus is particularly adaptable for use in connection with home central heating systems to permit a homeowner readily to diagnose a malfunction in his home heating system.

Gas-fired home heating systems involve both gas and electrical connections and are considered by most homeowners to be relatively complicated and somewhat dangerous. Accordingly, most homeowners are unwilling to attempt to diagnose or repair a malfunction in their home heating system. Therefore, it is necessary to utilize the services of a professional heating system serviceman, often at considerable expense to the homeowner. There has long been a need for a test or diagnostic instrument by which a homeowner can diagnose a malfunction in his own heating system, thereby greatly reducing and perhaps eliminating the work which needs to be done by professional repairmen. Flame-monitoring systems are known for use with various types of open flame heating apparatuses, but these systems are relatively complicated and serve to check only the presence or absence of a flame. No system is available for use by a homeowner capable of checking virtually all of the control functions of a heating system.

SUMMARY OF THE INVENTION

The present invention relates to apparatus for use in detecting the existence of a malfunction in a heating system and for determining the nature of the malfunction. More particularly, the present invention relates to a test apparatus of simple and economical construction suitable for use by a homeowner in analyzing and diagnosing malfunctions in his own home heating system. It is a general object of the invention to provide a test apparatus for use in connection with a heating system having a plurality of control elements connected to an associated source of AC electric power, the test apparatus including monitoring means for detecting and indicating the existence of a malfunction in the heating system, and analyzing apparatus for identifying the malfunctioning control element or elements.

It is an important object of this invention to provide test apparatus of the type set forth which includes indicator means, and detector means for detecting the presence or absence of a stream of heated air, the detector means being responsive to the absence of a stream of heated air a predetermined time after the thermostat calls for heat for energizing the indicator means.

In connection with the forgoing object, it is another object of this invention to provide a test apparatus of the type set forth, which further includes a thermostat-checking circuit responsive to an open circuit in the thermostat in the heating condition thereof for energizing the indicator means.

Still another object of the invention is to provide a test apparatus of the type set forth which includes indicator means, and switch means connected to the indicator means and adapted for connection to the heating system, the switch means having an indicator-checking condition for indicating the condition of the indicator means, and an analyzing condition for indicating the condition of each of the control elements of the heating system.

In connection with the foregoing object, it is another object of this invention to provide test apparatus of the type set forth, which includes a plurality of relatively high impedance indicator means equal in number to and corresponding respectively to the control elements of the heating system, and a multi-position switch having a plurality of contact banks equal in number to and corresponding respectively to the indicator means, each of the contact banks including a movable contact having an indicator-checking position for connecting the corresponding indicator directly across the associated source for indicating the condition of the indicator means, and an analyzing position for connecting the corresponding one of the indicator means parallel with the corresponding one of the control elements for indicating the condition thereof.

Further features of the invention pertain to the particular arrangement of the parts of the test apparatus whereby the above-outlined and additional operating features thereof are attained.

The invention, both as to its organization and method of operation, together with further objects and advantages thereof, will best be understood by reference to the following specification taken in connection with the accompanying drawings.

DESCRIPTION OF THE PREFERRED EMBODIMENTS

Figure 1:
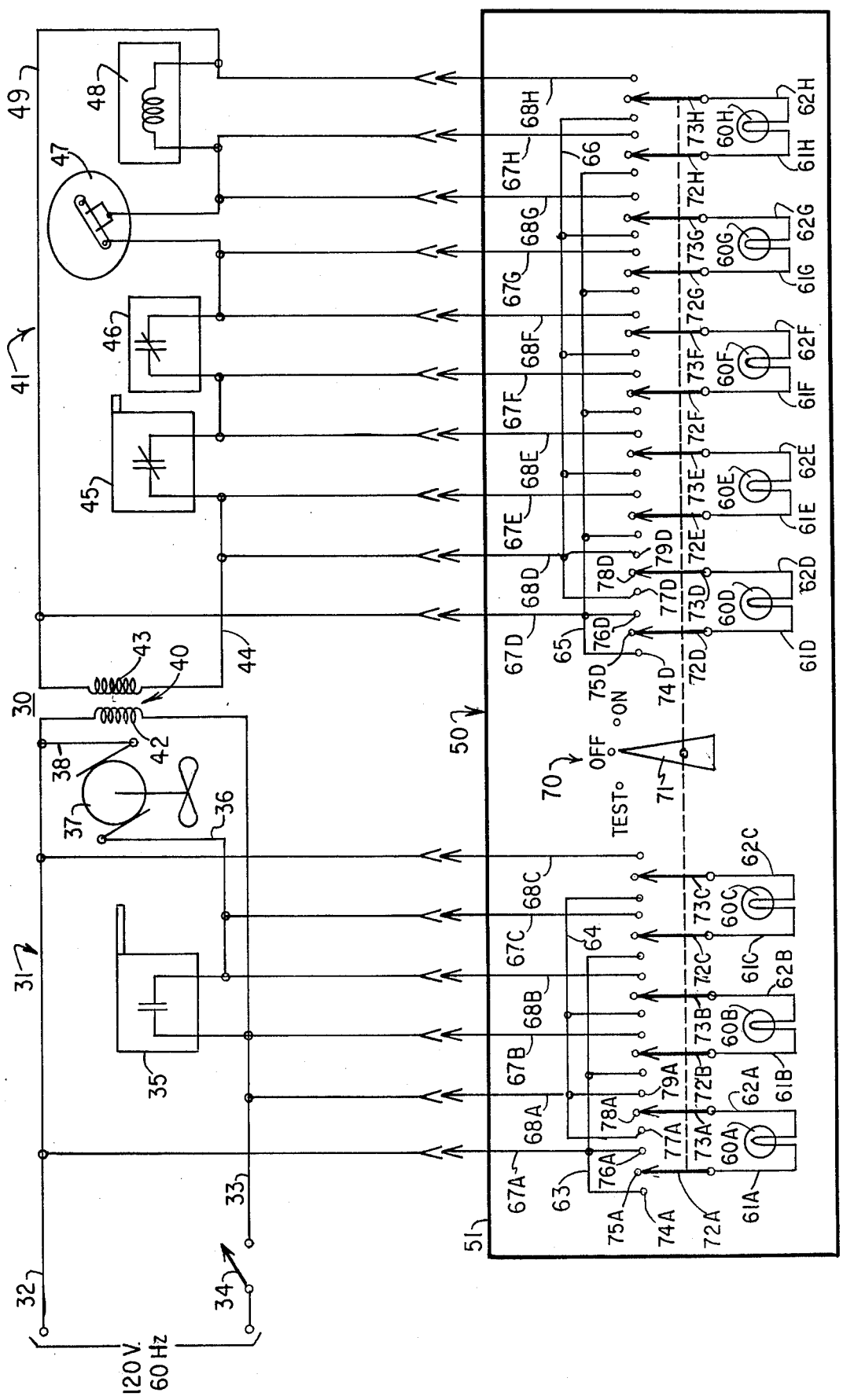
FIG. 1 is a schematic electrical circuit diagram of the analyzer portion of the test apparatus of the present invention, illustrating the manner in which it is connected to a central heating system.

Referring now in particular to FIG. 1 of the drawings, there is illustrated a central heating system, generally designated by the numeral 30, of the gas-fired forced air type used for home heating, and test apparatus comprising an analyzer, generally designated by the numeral 50, for determining the condition of the several control elements of the heating system 30. The heating system 30 includes a gas-fired furnace and a blower to force the heated air in a stream through ductwork to the various areas of the building to be heated, all in a well-known manner.

The electrical control circuit of the heating system 30 includes a high voltage portion 31 and a low voltage portion 41, the high voltage portion 31 being connected by a pair of conductors 32 and 33, through a power switch 34, to a source of 120 volts 60 Hz. AC electric power. Connected across the power lines 32 and 33 by conductors 36 and 38 is a series combination of a fan control switch 35 and a blower motor 37. Also connected across the power lines 32 and 33 in parallel with the fan switch 35 and blower motor 37 is the primary winding 42 of a step-down transformer 40, the secondary winding 43 of which has a voltage of approximately 24 volts thereacross. Connected across the secondary winding 43 of the transformer 40 by means of conductors 44 and 49 is the series combination of a limit switch 45, a pilot switch 46, a thermostat 47 and a gas valve 48.

The control circuit arrangement illustrated for the heating system 30 is a standard commercial arrangement, and the fan control switch 35, the blower motor 37, the limit switch 45, the pilot switch 46, the thermostat 47 and the gas valve 48 are all standard components of gas-fired forced air heating systems. However, as will be explained more fully below, the arrangement of these components in the heating system may vary with different commercial forms of heating systems. In heating systems having an electric pilot the pilot switch 46 is the switch contacts of the electric pilot. In systems having a non-electric pilot, the pilot switch 46 is a pilot pressure switch which must be added to the system to provide an electrical indication of whether the pilot is on, as will be explained more fully below.

In operation, when the thermostat 47 is in the on position, illustrated in FIG. 1, it completes a circuit through the gas valve 48, opening the gas valve 48 and firing the furnace. When the furnace reaches a predetermined temperature, the heat sensitive fan control switch 35 closes, thereby energizing the blower motor 37 for forcing a stream of heating air from the furnace and to the areas to be heated. When the areas to be heated reach a temperature sufficient to satisfy the thermostat, the thermostat turns off, thereby de-energizing and closing the gas valve 48 and shutting down the furnace. When the temperature in the furnace has dropped to a second predetermined temperature, the fan control switch 35 reopens, thereby de-energizing the blower motor 37. The heating system 30 continues operating through this cycle to maintain the areas to be heated at a temperature determined by the thermostat 47.

Should the furnace overheat beyond a predetermined upper limit, normally approximately 200°F., the heat sensitive limit switch 45 will open, thereby opening the gas valve and shutting off the furnace until the temperature thereof drops back down below the limit point, at which point the limit switch will reclose to reopen the gas valve 48. The pilot pressure switch 46 is normally closed as long as the pilot is lit. Should the pilot be extinguished, the pilot switch 46 automatically opens to prevent opening of the gas valve 48.

The analyzer 50 is preferably housed in a generally box-like cabinet or housing 51 adapted to be mounted on or adjacent to the furnace of the heating system 30. The analyzer 50 comprises a plurality of indicator lamps 60 and a three-position multiple pole switch 70 for connecting the indicator lamps 60 to the source of electric power and to the heating system 30. The analyzer 50 includes eight of the indicator lamps 60 for checking the condition of eight different functions or control components of the heating system 30, the indicator lamps being respectively designated by the suffixes A, B, C, D, E, F, G and H. The switch 70 is preferably in the form of a rotary selector switch having eight banks of contacts corresponding respectively to the indicator lamps 60A through 60H, the various elements of each of the contact banks also being designated with the same letter suffix as the corresponding indicator lamp. For simplicity, the interconnection of the lamp and switch components will be described in detail for only one of the indicator lamps viz., the lamp 60A, but it will be understood that like connections are made for each of the other indicator lamps 60B through 60H.

The terminals of the lamp 60A are respectively connected by conductors 61A and 62A to two movable contacts 72A and 73A of the selector switch 70. Each of the movable contacts 72A and 73A has associated with it three fixed contacts, corresponding respectively to a TEST or indicator-checking position, an OFF position and an ON or analyzing position of the selector switch 70. More particularly, the movable contact 72A is movable among a fixed contact 72A for the TEST position, a fixed contact 75A for the OFF position and a fixed contact 76A for the ON position, while the movable contact 73A is movable among a fixed contact 77A for the TEST position, a fixed contact 78A for the OFF position and a fixed contact 79A for the ON position. The selector switch 70 is movable among the three positions thereof by means of a control knob 71 disposed externally of the cabinet 51 and to which all of the movable contacts 72A through 72H and 73A through 73H are ganged, the movable contacts 72A–H and 73A–H all being shown in the OFF position in FIG. 1. It will be appreciated that the analyzer could be provided in a printed circuit in place of the mechanical switches.

The TEST contacts 74A–C are connected together by a conductor 63, while the TEST contacts 77A–C are connected together by a conductor 64. In like manner, the TEST contacts 74D–H are connected together by a conductor 65, while the TEST contacts 77D–H are connected together by a conductor 66. The ON contacts 76A–H are respectively connected to input conductors 67A–H, while the ON contacts 79A–H are respectively connected to input conductors 68A–H, the input conductors 67A–H and 68A–H all being preferably connected to suitable connectors for connection to the appropriate points in the heating system 30. More particularly, in the embodiment illustrated in FIG. 1, input conductor 67A is connected to power line 32 while input conductor 68A is connected to power line 33 for checking the power input of the heating system 30. Input conductors 67B and 68B are respectively connected to the terminals of the fan control switch 35 for checking the condition thereof. Input conductors 67C and 68C are respectively connected to the terminals of the blower motor 37 for checking the condition thereof. Input conductors 67D and 68D are connected across the secondary winding 43 of the transformer 40 for checking the power input to the low voltage portion 41 of the heating system 30. Input conductors 67E and 68E are connected respectively to the terminals of the limit control switch 45 for checking the condition thereof. Input conductors 67F and 68F are connected respectively to the terminals of the pilot switch 46 for checking the condition thereof. Input conductors 67G and 68G are respectively connected to the terminals of the thermostat 47 for checking the condition thereof. Input conductors 67H and 68H are respectively connected to the terminals of the gas valve 48 for checking the condition thereof.

The conductors 63 and 64 are respectively connected to the input conductors 67A and 68A and the conductors 65 and 66 are respectively connected to the input conductors 67D–68D. It will be understood that the indicator lamps 60A through 60H may be of any desired type, but it will be appreciated that the indicator lamps 60A–C are suitable for use with a 120-volt power source, while the indicator lamps 60D through H are suitable for use with a 24-volt power source.

In operation, when the selector switch 70 is in the OFF position illustrated in FIG. 1, it can be seen that the indicator lamps 60A through 60H are all disconnected from the heating system 30, whereby there is no power input to the analyzer 50 and all of the indicator lamps 60A through 60H are de-energized. When it is desired to utilize the analyzer 50 to check the condition of the various control elements of the heating system 30, the selector switch 70 is first moved to the TEST position, to check the condition of the indicator lamps 60A through 60H to see that they are all in proper working order. More particularly, it can be seen that when the selector switch 70 is in the TEST position, the indicator lamps 60A–C are connected in parallel across the 120-volt power source through the conductors 74A–C, 63, 67A, 77A–C, 64 and 68A. In like manner, the indicator lamps 60D through 60H are connected in parallel across the secondary coil 43 of the transformer 40 through conductors 74D–H, 65, 67D, 77D–H, 66 and 68D. Thus, when the selector switch 70 is in the TEST position, each of the indicator lamps 60A through 60H is connected directly across the power source for the associated portion of the heating system 30 for checking the condition of the indicator lamps. In this way, any burned out indicator lamps will be discovered and may be replaced.

When it is desired to test the condition of the control elements of the heating system 30, the selector switch 70 is moved to the ON position, whereupon each of the indicator lamps 60A–D will be connected directly across a corresponding one of the control elements of the heating system 30 through the conductors 67A–H and 68A–H as was described above.

When the heating system 30 is operating normally, the indicator lamps 60A and 60D will be energized, indicating that the power is being provided to the high voltage portion 31 and the low voltage portion 41 of the heating system 30. The indicator lamps 60E and 60F will be de-energized, since they are respectively short-circuited by the normally-closed limit control switch 45 and pilot switch 46. In this regard, it should be noted that each of the indicator lamps 60A–H has a relatively high impedance, preferably at least 200 ohms, whereas the impedance elements of the heating system 30, viz., the blower motor 37 and the gas valve 48 each has an impedance of only about 5 ohms.

When the thermostat 37 is in the condition illustrated in FIG. 1, wherein it is calling for heat, it shorts out the indicator lamp 60G, which will be de-energized, and it completes a circuit through the gas valve 48, opening the gas valve 48 as described above and also energizing the indicator lamp 60H. After a short time when the temperature in the furnace reaches the predetermined level, the fan control switch 35 is closed for energizing the blower motor 37, whereupon the indicator lamp 60B is shorted out and the indicator lamp 60C is energized. When the thermostat 47 is satisfied and switches off, the indicator lamp 60G is energized and the indicator lamp 60H is de-energized. This is because the resistance of the parallel combination of the gas valve 48 and the indicator lamp 60H is very small, in the range of about 5 ohms, in comparison to the resistance of the indicator lamp 60G which is in series with the parallel combination. Accordingly, virtually all of the voltage drop in the circuit is across the indicator lamp 60G, the remainder not being sufficient to turn on the lamp 60H. As the furnace cools down, the fan control switch 35 reopens, de-energizing the blower motor 37, and thereby energizing the indicator lamp 60B and de-energizing the indicator lamp 60C in the same manner as was just described with respect to the indicator lamps 60G and 60H.

Accordingly, it will be understood that when the heating system 30 is operating properly, the indicator lamps 60A and 60D will always be on to indicate power to the system, the indicator lamps 60E and 60F will always be off to indicate that the limit control switch 45 and the pilot switch 46 are in the proper normally closed conditions, while the indicator lamps 60B and 60C will alternately be on and the indicator lamps 60G and 60H will alternately be on as the thermostat 47 cycles between its on and off positions. If the indicator lamps of the analyzer 50 are in any other pattern, it indicates a malfunction in the heating system, the specific nature of the malfunction depending upon the specific pattern of the indicator lamps.

Normally the selector switch 70 will be maintained in the OFF position when not in use to preserve the indicator lamps 60A–H, the analyzer 50 being utilized only when there is an apparent malfunction in the heating system 30, viz., when the area to be heated falls below the temperature setting of the thermostat. In such a case the user would turn on the analyzer 50 to determine the nature of the malfunction. In identifying the malfunction, the user must read the indicator lamps of the analyzer 50 in light of the observable conditions of the heating system, such as whether or not the blower is operating and whether or not there is gas being provided to the burners. Table I shows the probable location of the malfunction for a series of different heating system conditions and analyzer indicator lamp conditions.

TABLE I

| | OBSERVABLE CONDITIONS | | | | | ANALYZER LAMPS | | | | | TROUBLE SPOT |
|---|---|---|---|---|---|---|---|---|---|---|---|
| | Gas | Air | Pwr. | Blwr. | Fan Control | Limit | Transf. | Gas Valve | Pilot | Thermo. | |
| (1) | Yes | No | On | On | Off | Off-On | On-Off | On-Off | Off | Off | Blower |
| (2) | Yes | No | On | Off | On | Off-On | On-Off | On-Off | Off | Off | Fan Control |
| (3) | No | Yes | On | On | Off | Off | On | Off | On | Off | Pilot Switch |
| (4) | No | Yes | On | On | Off | Off | On | On | Off | Off | Gas Valve |
| (5) | No | Yes | On | On | Off | Off | Off | Off | Off | Off | Transformer |
| (6) | No | No | Off | Off | Off | Off | Off | Off | Off | Off | Power Input |
| (7) | No | No | On | Off | On | Off | On | Off | Off | On | Thermostat |
| (8) | No | No | On | Off | On | On | Off | Off | Off | Off | Limit Switch |
| (9) | No | No | On | Off | On | Off | On | Off | On | Off | Pilot Switch |
| (10) | No | No | On | Off | On | Off | On | On | Off | Off | Gas Valve |
| (11) | No | No | On | Off | On | Off | Off | Off | Off | Off | Transformer |
| (12) | No | No | On | Off | On | Off | On | Off | Off | On | Thermo. & Fan Sw. |
| (13) | No | No | On | On | Off | Off | On | On | Off | Off | Gas Valve & Blwr. |

In Table I, under the heading "OBSERVABLE CONDITIONS" are two columns, the "Gas" column indicating whether or not gas is being provided to the furnace burners, and the "Air" column indicating whether or not a stream of air is being generated by the blower. It is assumed that in all cases one of the observable conditions is that the ambient temperature of the area to be heated is below the thermostat setting. Under the heading "ANALYZER LAMPS" are eight columns corresponding respectively to the indicator lamps for the several conditions and control functions of the heating system to be checked, the "Pwr." column corresponding to the lamp across the high voltage power source, the "Fan Control" column corresponding to the lamp across the fan control switch 35, the "Blwr." column corresponding to the lamp across the blower motor, the "Limit" column corresponding to the lamp across the limit control switch 45, the "Transf." column corresponding to the lamp across the transformer secondary 43, the "Gas Valve" column corresponding to the lamp across the gas valve 48, the " Pilot" column corresponding to the lamp across the pilot switch 46 and the "Thermo." column corresponding to the lamp across the thermostat 47. Under the heading "TROUBLE SPOT" is an indication of the malfunctioning element or elements in the heating system 30.

For purposes of illustration, only two of the malfunction conditions indicated in the table will be described in detail, the explanation of the other malfunction conditions being apparent from the table and the drawings. When the user observes that there is a flow of air through the heating system indicating that the blower is operating, but the burners are not lit, the table indicates that any of the malfunctions (3), (4) or (5) could exist, the user identifies the specific malfunction by use of the analyzer 50. If the indicator lamp for the pilot switch is on, this indicates that the pilot switch 46 is open and that there is some defect in the pilot or in the pilot switch, since in normal operation this switch should always be closed, shorting out the corresponding indicator lamp. If the analyzer lamps are in the conditions indicating normal operation of the system, thereby indicating that there is power to the gas valve 48, this means that the gas valve is defective since it is receiving electrical power. If the transformer lamp is off, in which event all the other lamps for the low voltage portion 41 of the heating system 30 will also be off, it indicates that no power is being provided to the low voltage portion 41 and that the transformer 40 is defective.

It should be noted that this condition where the blower is operating but the burners are not is possible in only certain types of heating systems. In many heating systems the fan control switch 35 is responsive solely to the heat in the furnace, whereby the fan control switch 35 cannot be closed and the blower motor 37 cannot be energized unless the burners are lit. However, in certain systems the fan control switch 35 is controlled not only by a heat sensing element but also by a time delay element, so that a predetermined time after the thermostat calls for heat the fan control switch 35 will close, regardless of whether or not the burners are lit. In such a system, the switches for the low and high voltage sides of the system could be separated and provided with two separate knobs 71 to help isolate the trouble spot.

If the user observes that there is no airflow through the system, but that the burners are lit, he again refers to the analyzer to determine the malfunctioning element. Thus, if the blower motor lamp is on, indicating that it is power to the blower motor 37, then the blower motor is defective since it is not operating. If the fan control lamp is on, it indicates that the fan control switch 35 is open and is therefore defective since it should be closed a short time after the burners are lit. It will be noted that where the blower is inoperative, the heat generated in the furnace cannot be dissipated and therefore, the furnace will ultimately overheat, thereby opening the limit control switch 45 and energizing the limit switch lamp. When the limit control switch 45 opens, it breaks the circuit to the gas valve 48, thereby de-energizing the indicator lamp for that element. As the system cools down, the limit switch 45 will reclose, thereby reopening the gas valve 48 and the heat will build up again. The system will continue cycling in this way until the blower is repaired, thereby causing the lamps for the limit switch 45 and the gas valve 48 to continually cycle on and off.

It will be noted that there are other types of malfunctions and combinations of malfunctions which might possibly occur in the heating system 30, but Table I and description sufficiently explain the theory of operation of the analyzer 50 so that the user can properly interpret the particular pattern of lamps in the analyzer 50, even if that pattern is not shown on Table I.

Figure 3:
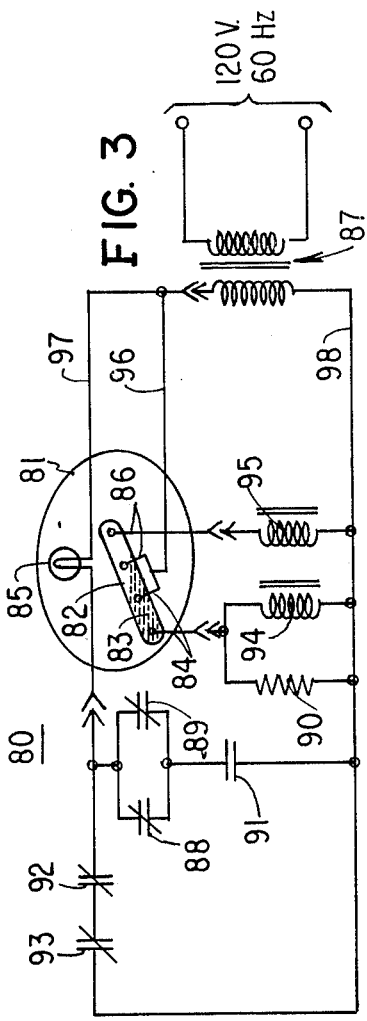
FIG. 3 is a schematic electrical circuit diagram of the monitoring portion of the test apparatus of the present invention, illustrating the manner in which it is connected to the thermostat of a heating system.

Referring now to FIG. 3 of the drawings, there is illustrated a schematic circuit diagram of a monitor unit, generally designated by the numeral 80, for continually monitoring the ambient conditions indicated under the heading "OBSERVABLE CONDITIONS" in the foregoing table. Normally, a user can readily detect the ambient temperature, and he can determine the condition of the blower by placing his hand in front of one of the air outlet vents. But a determination of whether or not gas is being provided to the burners requires an inspection of the furnace, which is frequently located in a relatively inaccessible spot such as a crawl space or the like. Furthermore, it may take some time for the ambient temperature to drop to the point where it is apparent that the heating system is not functioning properly, whereupon the user may not realize the existence of the malfunction for several hours. Accordingly, the monitor unit 80 continually monitors the heating system 30 to provide an indication within minutes of the occurrence of a malfunction in the heating system 30.

The monitor unit 80 preferably includes a modified thermostat 81 which has a standard mercury bulb 82 containing a quantity of mercury 83 for closing a circuit between contacts 84 when the system is calling for heat, as illustrated in FIG. 3. In addition, the thermostat 81 includes a pair of contacts 86 which are closed by the mercury 83 when the thermostat mercury bulb 82 is in the off condition. There is also provided an indicator lamp 85 mounted in the thermostat assembly. One terminal of the indicator lamp 85 is connected by a conductor 97 through a suitable connector to one terminal of the secondary coil of a step-down transformer 87, the primary of which is connected across the 120 volt 60 Hz., AC electric power source. The other terminal of the transformer secondary is connected to a conductor 98 which is connected to the other terminal of the indicator lamp 85 through the parallel combination of a normally closed heat sensing switch 88 and a normally closed airflow sensing or sail switch 89, and the normally open contacts 91 of a time delay switch element 90. The conductor 97 is connected by a conductor 96 to the two central ones of the thermostat contact pairs 84 and 86, the outer contact 84 being connected to the parallel combination of the time delay element 90 and a relay coil 94, which are in turn connected to the conductor 98. The outer contact 86 of the thermostat is connected through a relay coil 95 to the conductor 98. The relay coils 94 and 95 are respectively provided with normally closed contacts 92 and 93 which are connected in series with each other and in parallel with the combination of contacts 88, 89 and 91. The heat sensing switch 88 is preferably located in or on the furnace of the heating system, while the sail switch 89 is preferably located in the ductwork of the heating system downstream of the blower.

In operation, it can be seen that there are two circuit paths through which the indicator lamp 85 can be energized, viz., through the relay contacts 92 and 93 or through the time delay contacts 91 and either the heat sensing switch 88 or the sail switch 89. The lamp 85 is normally de-energized by reason of the normally open time delay switch contacts 91. When the thermostat is switched to the position illustrated in FIG. 3 wherein it calls for heat, the time delay element 90 is energized as is the relay coil 94, whereby the relay contacts 92 are opened to prevent energization of the lamp 85. When the furnace is heated up to a predetermined temperature, the heat sensing switch contacts 88 open and, when the blower begins to operate, the stream of air created thereby opens the sail switch 89. A predetermined time after switching of the thermostat 85 to its on condition, which time is sufficient for the switches 88 and 89 to open if the heating system is operating properly, the time delay contacts 91 close. Thus, it will be apparent that if either the furnace does not heat up to the required temperature, or the blower fails to operate within the predetermined time delay, one or both of the switches 88 and 89 will fail to open, thereby providing a path for energizing the lamp 85 when the time delay contacts 91 close. The lamp will indicate that there is a malfunction in the system, the specific nature of which malfunction can be determined through the use of the analyzer 50, as was described above.

When the thermostat is satisfied, it switches back to the off condition, thereby opening the circuit through the time delay element 90 and the relay coil 94, and thereby reclosing the relay contacts 92 and reopening the time delay contacts 91. Thus, when the heating system 30 cools down and the blower turns off reclosing the switches 88 and 89, the lamp 85 is prevented from being energized by the open contacts 91. The lamp 85 cannot be energized through the relay contacts 92 and 93, because simultaneously with the reclosing of the relay contacts 92, the relay coil 95 is energized, opening the contacts 93.

It can be seen that the relays 94 and 95 serve to monitor the continuity of the circuit through the thermostat 85. Thus, if because of the defect in the thermostat 85 or in the lead wires thereof the contacts 84 should fail to close when the thermostat 81 is calling for heat as in FIG. 3, then the relay 94 will not be energized and the relay contacts 92 will remain closed along with the relay contacts 93, thereby providing a path for energizing the lamp 85. Thus, the monitor unit 80 can indicate the presence of a malfunction anywhere in the heating system 30, including the thermostat.

Figure 2:
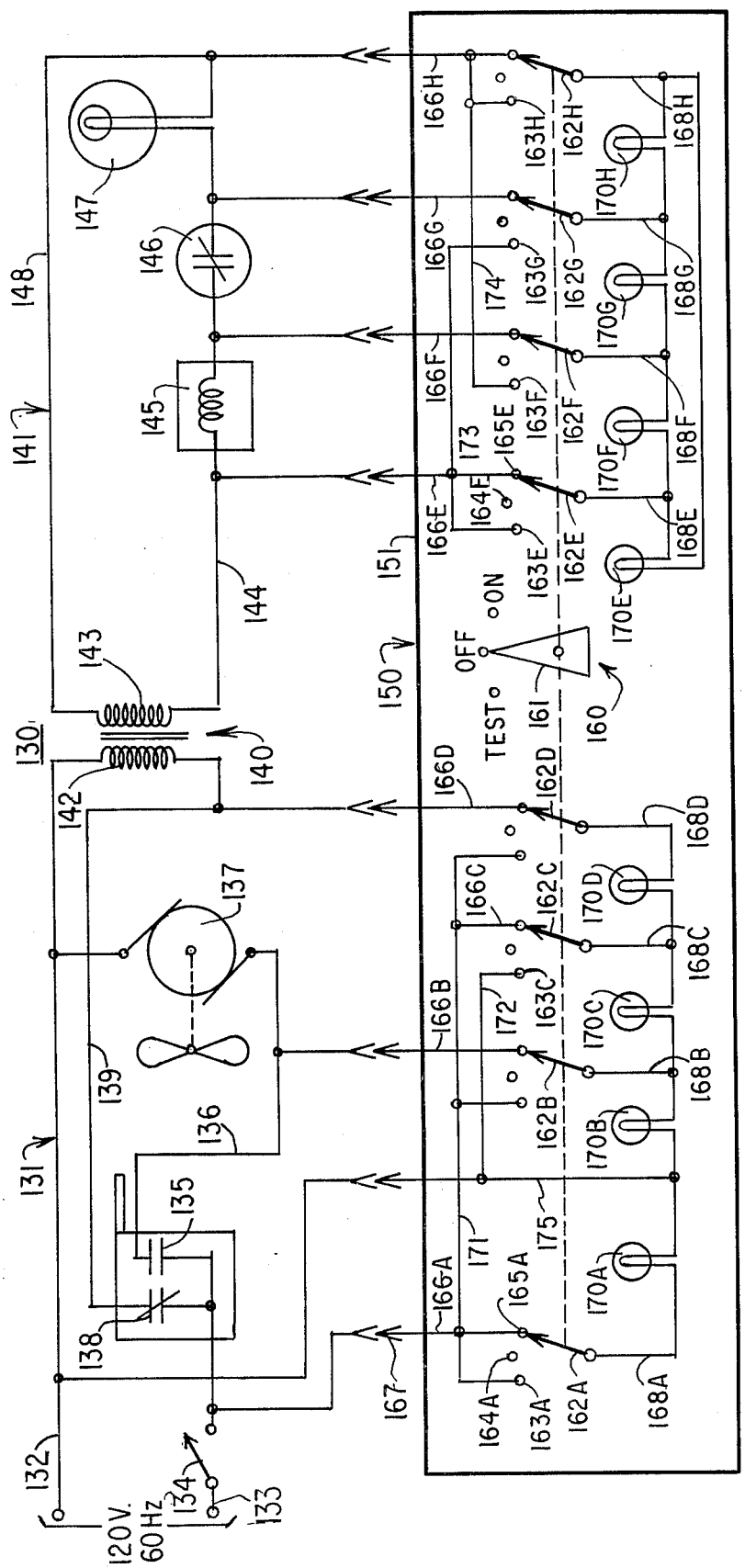
FIG. 2 is a diagrammatic electric circuit diagram similar to FIG. 1, illustrating an alternative embodiment of the analyzing apparatus of the present invention.

Referring now to FIG. 2 of the drawings, there is illustrated an alternative embodiment of the test apparatus of the present invention. As was described above, the analyzer 50 is quite flexible in that any one of the lamps 60A–H can be connected across any one of the heating system control elements, whereby the lamps can be connected to the control elements in any order that the user desires. Thus, the analyzer 50 can be used with any of the gas-fired forced air heating systems presently commercially available. However, the vast majority of the commercially available heating systems, probably in excess of ninety percent, all have the control elements thereof arranged in the same manner, namely that shown in FIG. 2. Accordingly, it has been recognized that for most heating systems the flexibility afforded by the analyzer 50 is not necessary and that a considerably simplified analyzer can be provided which will be much less costly to produce and will serve the vast majority of gas-fired forced air heating systems in use.

As can be seen from FIG. 1, the conductors 62A and 61B are connected to the same point in the heating system 30, the conductors 62B and 61C are connected to the same point in the heating system 30, and the conductors 62C and 61A are connected to the same point in the heating system 30. Likewise in the low voltage portion 41 of the heating system 30 the conductors 62D and 61E are connected to the same point, the conductors 62E and 61F are connected to the same point, the conductors 62F and 61G are connected to the same point, the conductors 62G and 61H are connected to the same point and the conductors 62H and 61D are connected to the same point. Accordingly, each of these conductors which is connected to the same point in the heating system can be connected together internally of the analyzer, thereby eliminating half the input conductors to the analyzer and half the switch contacts therein. This is essentially what has been done in the embodiment of FIG. 2.

In FIG. 2 the heating system has been generally designated by the numeral 130 and includes a high voltage portion 131 and a low voltage portion 141. Power is supplied to the high voltage portion 131 from a source of 120-volt 60 Hz. power by a pair of power lines 132 and 133 through a power switch 134. The power line 133 is connected to a fan control switch 135 which is in turn connected by a conductor 136 to a blower motor 137 which is in turn connected to the power line 132. The power line 133 is also connected to a limit control switch 138 which is connected by a conductor 139 to one terminal of the primary winding 142 of a step-down transformer 140, the other terminal of which winding is connected to the power line 132. The secondary winding 143 of the transformer 140 produces approximately 24 volts at the terminals thereof. Connected in series across the secondary winding 143 by conductors 144 and 148 are a gas valve 145, a pilot switch 146 and a thermostat 147. The arrangement of the heating system 130 is that which is found in the vast majority of heating systems, and it can be seen that the basic difference between this arrangement and that of the heating system 30 is that the limit switch is in the high voltage portion of the system rather than in the low voltage portion.

Also shown in FIG. 2 is an analyzer, generally designated by the numeral 150, which is essentially similar to the analyzer 50 with the exception that half of the input conductors and half of the switch contacts have been eliminated. The analyzer 150 is preferably mounted in a housing or cabinet 151 adapted to be mounted on or adjacent to the furnace of the heating system 130. The analyzer 150 includes a three-position rotary selector switch 160 having a control knob 161 ganged to a plurality of movable contacts 162A through 162H. Respectively associated with the movable contacts 162A through 162H are a plurality of indicator lamps 170A through 170H. Also associated with each of the movable contacts 162A through 162H are three fixed contacts 163, 164 and 165 corresponding respectively to a TEST position, an OFF position and an ON position, the fixed contacts being designated with the same suffix as the corresponding movable contact 162.

The ON contacts 165A–H are respectively connected to input conductors 166A–H, each of which, with the exception of the input conductor 166C, is connected to a suitable connector for connection to the appropriate point in the heating system 130. The TEST contacts 163A, B and D are all interconnected by a conductor 171 which is also connected to the conductors 166A and 166C. The test contact 163C is connected by a conductor 172 to a conductor 175 which is in turn connected to a suitable connector for connection to the heating system 130. In like manner, the test contacts 163E and 163G are interconnected by a conductor 173 which is in turn connected to the input conductor 166E, while the test contacts 163B and 163H are interconnected by a conductor 174 which is in turn connected to the conductor 166H.

The movable switch contacts 162A–H are respectively connected to the lamps 170A–H by conductors 168A–H. More particularly, the conductor 168A is connected to one terminal of the lamp 170A, the other terminal thereof being connected to the conductor 175 and to one terminal of the lamp 170B. The other terminal of the lamp 170B is connected to the conductor 168B and to one terminal of the lamp 170C. The other terminal of the lamp 170C is connected to the conductor 168C and to one terminal of the lamp 170D, the other terminal of which is connected to the conductor 168D. The conductor 168E is connected to one terminal of each of the lamps 170E and 170F, the other terminal of the lamp 170F being connected to the conductor 168F and to one terminal of the lamp 170G. The other terminal of the lamp 170G is connected to the conductor 168G and to one terminal of the lamp 170H. The other terminal of the lamp 170H is connected to the conductor 168H and is also connected by a conductor 169 to the other terminal of the lamp 170E.

The operation of the analyzer 150 is essentially the same as was described above with respect to the analyzer 50. Thus, it can be seen that when the selector switch 160 is in the OFF position, the lamps 170A–H are all disconnected from the heating system 130 and are de-energized. When the selector switch 160 is in the TEST position, each of the lamps 170A–D is connected across the 120-volt power source and each of the lamps 170E–H is connected across the secondary winding 143 of the transformer 140 for checking the condition of the lamps.

When the selector switch 160 is moved to the ON condition thereof illustrated in FIG. 2, the lamp 170A is connected directly across the 120-volt power source by the conductors 166A and 175; the lamp 170B is connected directly across the blower motor 137 by the conductors 175 and 166B; the lamp 170C is connected directly across the fan control switch 135 by the conductors 166B and 166C, 171 and 166A; and the lamp 170D is connected directly across the limit control switch 138 by the conductors 166D and 166C, 171 and 166A. In like manner, the lamp 170E is connected directly across the transformer secondary winding 143 by conductors 166E and 166H; the lamp 170F is connected directly across the gas valve 145 by conductors 166E and 166F; the lamp 170G is connected directly across the pilot switch 146 by conductors 166F and 166G; and the lamp 170H is connected directly across the thermostat 147 by conductors 166G and 166H.

As was described above in connection with the analyzer 50, when the heating system 130 is operating properly, the lamp 170A associated with the high voltage power source and the lamp 170E associated with the low voltage power source will always be on, while the lamp 170D associated with the limit control switch 138 and the lamp 170G associated with the pilot switch 146 will always be off. The lamp 170B associated with the blower motor 137 and the lamp 170C associated with the fan control switch 135 will alternately be on as the thermostat cycles on and off and, in the same manner, the lamp 170F associated with the gas valve 145 and the lamp 170A associated with the thermostat 147 will alternately be on. In the various conditions of malfunction of the heating system 130, the analyzer lamps associated with the various heating system control elements will assume the conditions designated in Table I described above.

While in the preferred embodiments of the invention the indicating means 60A–H, 85 and 170A–H have been disclosed as being lamps, it will be understood that any suitable resistance type indicating element could be used such as a meter or some other form of alarm signal. It will also be understood that any suitable type of connector element could be utilized for connecting the analyzers 50 and 150 to the heating systems 30 and 130 and for connecting the monitor unit 80 to the thermostat 85, for example, plug and socket arrangements, alligator clips, and the like.

While the test apparatus of the present invention has been described in connection with a gas-fired forced air heating system, it will be understood that it could be used with other types of heating systems, or with any control system having a plurality of electric control elements. Similarly, while the analyzer has been disclosed as having eight indicator lamps for simultaneously checking eight control elements, it will be understood that any desired number of indicator lamps could be used.

From the foregoing, it can be seen that there has been provided a novel test apparatus for diagnosing malfunctions in a heating system. More particularly, there has been disclosed test apparatus which includes a monitor unit for continually monitoring the presence or absence of a stream of heated air from the heating system and the integrity of the thermostat circuit, as well as an analyzing unit for identifying the specific element of the heating system which is malfunctioning. It is an important feature of the present invention that the monitor unit and the analyzing unit may be used either separately or together.

There has also been disclosed a simple and economical heating system analyzer which can readily be utilized by an unskilled homeowner to check the condition of a plurality of different control elements of his heating system.

There has also been disclosed an analyzing unit of the character described which has a TEST condition for checking the indicator lamps, an OFF condition for preserving the indicator lamps when the unit is not in use and an ON condition for checking the heating system.

While there have been described what are at present considered to be the preferred embodiments of the invention, it will be understood that various modifications may be made therein, and it is intended to cover in the appended claims all such modifications as fall within the true spirit and scope of the invention.

What is claimed is:

1. Test apparatus for use in connection with a heating system including a plurality of control elements connected to an associated source of AC electric power, said test apparatus comprising only a plurality of indicator means equal in number to and corresponding respectively to the control elements, and passive switch means connected to each of said indicator means and to the associated source of AC electric power and adapted for connection to said heating system, said switch means having an indicator-checking condition disconnecting each of said indicator means from the control elements and interconnecting each of said indicator means and the associated source for simultaneously indicating the condition of each of said indicator means, said switch means having an analyzing condition interconnecting said indicator means respectively in parallel with the corresponding control elements for simultaneously indicating the condition of each of said control elements, said switch means being selectively operable between the indicator-checking and analyzing conditions thereof without consumption of electricl power.

2. The test apparatus set forth in claim 1, wherein said switch means has an off condition disconnecting said indicator means from the associated source and from the control elements.

3. The test apparatus set forth in claim 1, wherein said indicator means includes a plurality of lamps.

4. Test apparatus for use in connection with a heating system having a plurality of control elements including at least one voltage-responsive low impedance control element all connected in series with an associated source of AC electric power, said test apparatus comprising a plurality of relatively high impedance indicator means equal in number to and corresponding respectively to the control elements, and a multi-position passive switch having a plurality of contact banks equal in number to and corresponding respectively to said indicator means and being movable among the positions thereof without consumption of electrical power, each of said contact banks including a movable contact connected to one terminal of the corresponding indicator means, said switch having an indicator-checking position wherein said movable contact of each contact bank is effective to disconnect the corresponding indicator means from the corresponding one of the control elements and to connect the corresponding indicator means simultaneously directly across the associated source for indicating simultaneously the condition of each of said indicator means, said switch having an analyzing position wherein said movable contacts of said contact banks are simultaneously effective to connect the corresponding ones of said indicator means respectively in parallel with the corresponding ones of the control elements for simultaneously indicating the condition of each of the control elements, the impedance of each of said indicator means being such that when it is connected in series with the voltage-responsive low impedance control element the voltage drop across the control element is insufficient to cause it to respond.

5. The test apparatus set forth in claim 4, wherein said switch comprises a rotary selector switch.

6. The test apparatus set forth in claim 4, including a plurality of connecting conductors equal in number to and corresponding respectively to said indicator means for connecting said test apparatus to said heating system.

7. The test apparatus set forth in claim 4, including a plurality of conductors equal in number to twice the number of said indicator means, said conductors being arranged in pairs corresponding respectively to said indicator means for connecting said test apparatus to said heating system.

8. The test apparatus set forth in claim 4, wherein the heating system includes a high voltage portion including certain ones of the control elements and a low voltage portion including the others of the control elements, said indicator means including a plurality of first indicator means each having a first impedance and corresponding to the control elements in the high voltage portion of said heating system, and a plurality of second indicator means each having a second impedance corresponding to the control elements in the low voltage portion of said heating system.

9. The test apparatus set forth in claim 4, wherein said switch has an off position wherein said movable contact of each contact bank is effective for disconnecting the corresponding indicator means from the associated source and from the control elements.

10. The test apparatus set forth in claim 4, including eight indicator means corresponding respectively to eight control elements in said heating system.

* * * * *